(12) United States Patent
Liu

(10) Patent No.: US 10,106,709 B2
(45) Date of Patent: Oct. 23, 2018

(54) SINGLE-COMPONENT LOW HARDNESS CONDUCTIVE ADHESIVE AND METHODS OF MANUFACTURE AND USE THEREOF

(71) Applicant: Dongguan Nystein Electronic Materials Co., LTD., Dongguan, Guangdong (CN)

(72) Inventor: Hongyang Liu, Dongguan (CN)

(73) Assignee: Dongguan Nystein Electronic Materials Co., LTD., Dongguan (CN)

( * ) Notice: Subject to any disclaimer, the term of this patent is extended or adjusted under 35 U.S.C. 154(b) by 0 days.

(21) Appl. No.: 15/619,391

(22) Filed: Jun. 9, 2017

(65) Prior Publication Data
US 2018/0022969 A1    Jan. 25, 2018

(30) Foreign Application Priority Data

Jul. 21, 2016 (CN) .......................... 2016 1 0578899

(51) Int. Cl.
| | | |
|---|---|---|
| *H01B 1/22* | (2006.01) | |
| *C09J 9/00* | (2006.01) | |

(Continued)

(52) U.S. Cl.
CPC ............... *C09J 9/02* (2013.01); *C08G 77/04* (2013.01); *C08G 77/08* (2013.01); *C08J 3/212* (2013.01); *C09J 11/04* (2013.01); *C09J 11/06* (2013.01); *C09J 183/04* (2013.01); *H05K 9/0083* (2013.01); *C08J 2383/04* (2013.01); *C08K 3/04* (2013.01); *C08K 9/02* (2013.01); *C08K 2201/001* (2013.01); *C08K 2201/005* (2013.01);

(Continued)

(58) Field of Classification Search
CPC ............ H01B 1/00; H01B 1/122; C09J 3/321; H05K 3/321; C08K 2201/001
See application file for complete search history.

(56) References Cited

U.S. PATENT DOCUMENTS

| 6,045,755 A * | 4/2000 | Lebl ........................... B01J 3/03 |
| | | 422/131 |
| 6,486,237 B1 * | 11/2002 | Howe ....................... C08K 7/22 |
| | | 523/113 |
| 2009/0156755 A1 * | 6/2009 | Herzig ................... C08G 77/50 |
| | | 525/478 |

FOREIGN PATENT DOCUMENTS

| CN | 101412851 A | 4/2009 |
| CN | 101445715 A | 6/2009 |
| CN | 104371106 A | 2/2015 |

OTHER PUBLICATIONS

English language machine translation of CN 101412851 (pub date Apr. 2009).*

(Continued)

*Primary Examiner* — Mark Kopec
(74) *Attorney, Agent, or Firm* — Metis IP LLC

(57) ABSTRACT

A single-component conductive adhesive with low hardness, and method of manufacture and use are provided. The conductive adhesive may include a resin composition, an organic solvent and nickel-coated graphite powder. The weight ratio of the resin composition to nickel-coated graphite powder may be 20%:80% or 40%:60%. The weight of the organic solvent may be 20-40% the weight of the resin composition. The resin composition may include 20-40% by weight of vinyl-terminated polydimethylsiloxane (PDMS), 5-15% by weight of H—Si polysiloxane oil, 0.05-0.15% by weight of polymerization inhibitor, and 0.1-1% by weight of encapsulated platinum complex.

5 Claims, 1 Drawing Sheet

(51) Int. Cl.
*C09J 9/02* (2006.01)
*C08G 77/04* (2006.01)
*C08G 77/08* (2006.01)
*C08J 3/21* (2006.01)
*C09J 11/04* (2006.01)
*C09J 11/06* (2006.01)
*C09J 183/04* (2006.01)
*H05K 9/00* (2006.01)
C08K 3/04 (2006.01)
C08K 9/02 (2006.01)
H01B 1/24 (2006.01)
H01B 3/46 (2006.01)

(52) U.S. Cl.
CPC .......... *C08K 2201/011* (2013.01); *H01B 1/22* (2013.01); *H01B 1/24* (2013.01); *H01B 3/465* (2013.01)

(56) References Cited

OTHER PUBLICATIONS

First office action for Chinese application No. 201610578899.4 dated Oct. 10, 2017, 12 pages.

\* cited by examiner

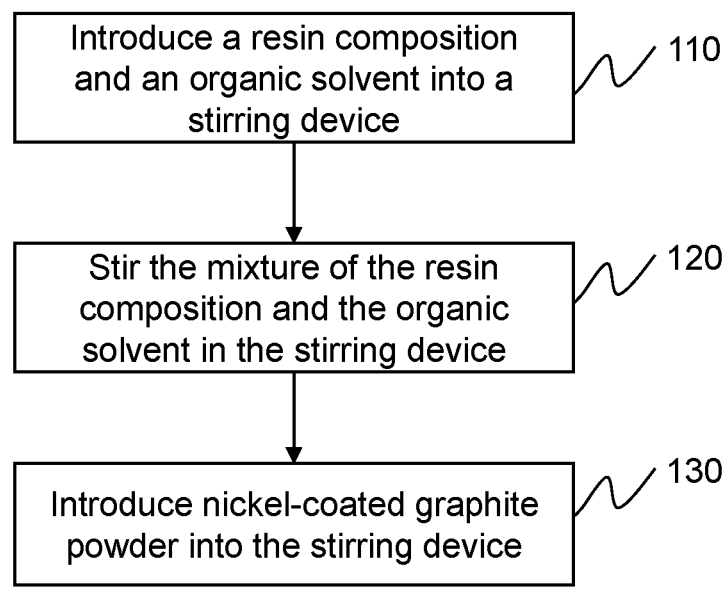

SINGLE-COMPONENT LOW HARDNESS CONDUCTIVE ADHESIVE AND METHODS OF MANUFACTURE AND USE THEREOF

CROSS-REFERENCE TO RELATED APPLICATIONS

This application claims priority to Chinese Application No. 201610578899.4, filed on Jul. 21, 2016, the entire content of which is incorporated herein by reference.

TECHNICAL FIELD

The present disclosure generally relates to electromagnetic shielding materials, and more specifically, relates to conductive adhesive and methods of manufacturing the conductive adhesive.

BACKGROUND

Conductive adhesives are bonding agents having electrical conductivity after being cured or dried. Generally, conductive adhesives include a base resin and a conductive filler (i.e., conductive particles). The base resin in the conductive adhesive, which is a bonding agent, is mainly applied to the surfaces of base materials and is adhered to the surfaces at a proper curing temperature. However, current products of conductive adhesive may have the following problems: 1. due to the vulcanization process, while the hardness of adhesive tapes made of the conductive adhesive may be enhanced, its elasticity may be weak, and the adhesive tapes may become easily deformed and susceptible to fracture under uneven stress, which may adversely affect the compression operation; 2. its electrical resistance may still be relatively large, and because the product is manufactured according to standard operation procedures, uncertain factors in external environment may affect its service life; 3. in the process of locking, when a higher stress is applied to screws, the resistance from the adhesive tapes may increase and there may be potential risks of the deformation of the base materials; due to the enhancement of the hardness of the adhesive tapes, the deformation of the base materials needs to be evaluated in the locking process, which may affect the project progress. Chinese patent No. 200810203319.9 discloses an organic silicone conductive adhesive composing of resin composition, organic solvent, and aluminum powder. The aluminum powder disclosed in the reference has good conductivity, but its mechanical property may not meet the requirements of elasticity when it is used to encapsulate the outer base material. And the conductive adhesive will become easily deformed or even break upon uneven stress or excessive bending when it contains a higher proportion of the aluminum powder.

SUMMARY

The present disclosure discloses conductive adhesives with low hardness and electromagnetic shielding capability. Embodiments of technical features of the present disclosure are set forth below to solve the problems in the art:

A single-component conductive adhesive with low hardness may include a resin composition, an organic solvent and nickel-coated graphite powder. The weight ratio of the resin composition to the nickel-coated graphite powder may be 20%:80% or 40%:60%; the weight of the organic solvent may be 20-40% the weight of the resin composition. The resin composition may include 20-40% by weight of vinyl-terminated polydimethylsiloxane (PDMS), 5-15% by weight of H—Si polysiloxane oil, 0.05-0.15% by weight of polymerization inhibitor, and 0.1-1% by weight of encapsulated platinum complex.

In some embodiments, the particles of the nickel-coated graphite powder may have irregular round or oval shapes with a size distribution of 50-150 μm.

Methods of manufacturing the single-component conductive adhesive with low hardness are also disclosed. The conductive adhesive with low hardness and electromagnetic shielding capability may be obtained by performing one or more of the following operations. The resin composition and the organic solvent may be introduced into a stirring device. The temperature in the stirring device may be kept at 23±5° C. The mixture of the resin composition and the organic solvent may be stirred for 5-10 minutes at a stirring speed of 200 r/min. In the stirring process, the pressure in the stirring device may be kept below 0.08 MPa. The nickel-coated graphite powder may be introduced into the stirring device after the mixture is homogenized. The mixture and the introduced nickel-coated graphite powder may be stirred for 5-10 minutes.

In some embodiments, the nickel-coated graphite powder may be introduced into the sealed stirring device in two or more times. Between each time of the introduction of the nickel-coated graphite powder, the mixture and the introduced nickel-coated graphite powder may be stirred for 5-10 minutes.

A method of using the conductive adhesive is provided. The conductive adhesive may be cured after being heated for 30 minutes at a temperature of 150° C.

The advantage of the conductive adhesive in the present disclosure is that it may be dispensed onto structures or elements, such as metal substrates or shells with complex geometry, to form conductive gaskets after curing. With good elasticity, conductivity and adhesive property, the conductive gaskets may be used for electromagnetic shielding, grounding, and sealing. In addition, the conductive adhesive may bond to the surface of plastic or metal substrates at low compressive stress levels.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 1 is an exemplary process for manufacturing the single-component conductive adhesive according to some embodiments of the present disclosure.

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, and/or components, have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The single-component conductive adhesive may include a resin composition, an organic solvent, and nickel-coated graphite powder. The weight ratio of the resin composition to the nickel-coated graphite powder may be 20%:80% or 40%:60%. The weight of the organic solvent may be 20-40% the weight of the resin composition. The resin composition may comprise vinyl-terminated polydimethylsiloxane (PDMS), H—Si polysiloxane oil, polymerization inhibitor, and platinum complex. The vinyl-terminated PDMS may be 20-40% by weight of the resin composition. The H—Si polysiloxane oil may be 5-15% by weight of the resin composition. The polymerization inhibitor may be 0.05-0.15% by weight of the resin composition. The platinum complex may be 0.1-1% by weight of the resin composition.

In some embodiments, the platinum complex may be encapsulated in any suitable form, for example, in a capsule, as a tablet, in a nano-film. In some embodiments, the platinum complex may be encapsulated in a capsule using microcapsule techniques. Successive membranes may be used in the microcapsule technique to wrap the platinum complex. In some embodiments, the successive membranes may comprise polymer compound. For example, the successive membranes may comprise natural or synthetic polymer compound, such as protein, cellulose, starch, etc. In some embodiments, the successive membranes may respond to a certain melting point. At a temperature higher than the melting temperature, the successive membranes may disappear, and the platinum complex may react with the H—Si polysiloxane oil around it. In some embodiments, the melting point may be higher than the room temperature. In some embodiments, the conductive adhesive may be heated to a temperature higher than the melting point to initiate the reaction between the platinum complex and the H—Si polysiloxane oil. In some embodiments, the successive membranes may be compatible with silica gel.

The particles of the nickel-coated graphite powder in the conductive adhesive may have regular or irregular shapes. For example, the particles may have a regular shape (e.g., an round shape). As another example, the particles may have an irregular shape (e.g., a shape of a raindrop). The size distribution of the particles may be within a certain range. For example, the nickel-coated graphite powder may have a size distribution of 50-150 μm. In some embodiments, the particles of the nickel-coated graphite powder may have nearly round shapes (e.g., oval shape) with a size distribution of 50-150 μm.

FIG. 1 is an exemplary process of manufacturing the single-component conductive adhesive. In 110, the resin composition and the organic solvent may be introduced into a stirring device. The stirring device may be sealed after the resin composition and the organic solvent are introduced into the stirring device. The stirring device may be any suitable devices (e.g., a vacuum mixer, a close-clearance mixer). In some embodiments, the stirring device may control various parameters, including, for example, temperature, pressure, stirring time, and/or stirring speed. The resin composition and the organic solvent may be introduced into the stirring device at the ratio described elsewhere in this disclosure (e.g., the weight of the organic solvent may be about 20-40% the weight of the resin composition).

In 120, the mixture of the resin composition and the organic solvent may be stirred in the sealed stirring device. The mixture may be stirred at certain conditions. For example, the mixture may be stirred for 5-10 minutes at a stirring speed of 200 r/min. During the stirring process, the temperature in the stirring device may be kept in a certain range (e.g., within 23±5° C.), and the pressure may also be kept in a certain range (e.g., below 0.07 MPa). In some embodiments, the stirring process may continue until the mixture is homogenized.

In 130, the nickel-coated graphite powder may be introduced into the stirring device. In some embodiments, the total amount of the nickel-coated graphite powder may be introduced into the stirring device for one time. The first mixture and the introduced nickel-coated graphite powder may be stirred for 5-10 minutes. In some embodiments, the nickel-coated graphite powder may be successively introduced and homogenized into the mixture of the resin composite and the organic solvent.

In some embodiments, the total amount of the nickel-coated graphite powder may be divided into two or more portions by weight. Each portion of the nickel-coated graphite powder may be introduced into the stirring device at a regular interval (e.g., between the introduction of each portion of the nickel-coated graphite powder, the stirring device may stir 5-10 minutes to homogenize the introduced portion of the nickel-coated graphite powder). For example, the total amount of the nickel-coated graphite powder may be divided into two portions, including a first portion and a second portion. The first portion of the nickel-coated graphite powder may be introduced into the stirring device. The introduced first portion may be stirred, together with the first mixture, for 5-10 minutes to obtain a second mixture. Then the second portion of the nickel-coated graphite powder may be introduced into the second mixture. The introduced second portion may be stirred, together with the second mixture, for another 5-10 minutes. The first portion and second portion may have equal or unequal weight.

It should be noted that the above description of the manufacturing process is merely provided for the purposes of illustration, and not intended to limit the scope of the present disclosure. For persons having ordinary skills in the art, multiple variations and modifications may be made under the teachings of the present disclosure. For example, operations in 110 and 120 may be performed at the same time to accelerate the mixing of the resin composite and the organic solvent. However, those variations and modifications do not depart from the scope of the present disclosure.

The manufactured conductive adhesive may be stored at a certain storage temperature to keep its physical stability and/or chemical stability. The storage temperature may range from about −30° C. to −10° C. The conductive adhesive may have a pot life, within which the conductive is available. The pot life may relate to the storage conditions of the conductive adhesive. For example, exposure to a temperature higher than the storage temperature −30° C. to −10° C. may shorten its pot life. The pot life of the conductive adhesive may be 6 month while it is stored at a temperature ranging from −30° C. to −10° C.

The conductive adhesive may be thermally curable from a liquid form to an adherent and coherent solid at a certain temperature (which is also referred to as the thermosetting temperature) for a period (which is also referred to as the thermosetting time). In some embodiments, at least one of the thermosetting temperature and the thermosetting time of the conductive adhesive may relate to the ratio of the components included therein. The thermosetting temperature of the conductive adhesive may be 150° C., and the thermosetting time may be 30 minutes.

EXAMPLES

The following examples are provided to help better understanding the present disclosure. It is not intended to limit the scope the present disclosure. For persons having ordinary skills in the art, a certain amount of variations, changes, and/or modifications may be deducted under the guidance of the present disclosure. Those variations, changes, and/or modifications do not depart from the scope of the present disclosure.

Example 1

Example 1 is provided as a preferred embodiment of the present disclosure. The single-component conductive adhesive with low hardness may include a resin composition, an organic solvent, and nickel-coated graphite powder. The weight ratio of the resin composition to the nickel-coated graphite powder may be 31:62. The weight of the organic solvent may be 22% the weight of the resin composition. The resin composition may comprise vinyl-terminated PDMS, H—Si polysiloxane oil, polymerization inhibitor, and platinum complex. The vinyl-terminated PDMS may be 25% by weight of the resin composition. The H—Si polysiloxane oil may be 5% by weight of the resin composition. The polymerization inhibitor may be 0.1% by weight of the resin compostion. The platinum complex may be 1% by weight of the resin compostion. The platinum complex may be encapsulated in a capsule using microcapsule techniques. Successive membranes comprising polymer compound may be used in the microcapsule technique to wrap the platinum complex. At the room temperature, the successive membranes may maintain stability and prevent the reaction between the platinum complex and the H—Si polysiloxane oil by separating the two components from each other. The successive membranes may fuse or melt at a certain temperature, which may enable the reaction between the platinum complex and the H—Si polysiloxane oil. In some embodiments, the successive membranes may be compatible with silica gel.

In the present example, the particles of the nickel-coated graphite powder may have irregular round or oval shapes with a size distribution of 50-150 μm.

The methods of manufacturing the single-component conductive adhesive with low hardness described in example 1 are provided. The conductive adhesive with low hardness may be obtained by performing one or more of the following operations. The resin composition and the organic solvent may be introduced into a stirring device. The stirring device may be sealed after the resin composition and the organic solvent are introduced into the stirring device. The temperature in the stirring device may be kept at 23±5° C. The mixture of the resin composition and the organic solvent may be stirred in the stirring device for 5-10 minutes at a stirring speed of 200 r/min. During the stirring process, the pressure in the stirring device may be kept below 0.07 MPa. The nickel-coated graphite powder may be introduced into the stirring device after the resin composition and the organic solvent is homogenized. The mixture and the introduced nickel-coated graphite powder may be stirred for 5-10 minutes.

In the present example, the nickel-coated graphite powder may be divided into portions by weight of its total amount. Between the introduction of each portion of the nickel-coated graphite powder into the stirring device, 5-10 minutes may be needed to homogenize the added portion of nickel-coated graphite powder in the mixture.

Example 2

The single-component conductive adhesive with low hardness may include a resin composition, an organic solvent, and nickel-coated graphite powder. The weight ratio of the resin composition to the nickel-coated graphite powder may be 31:60. The weight of the organic solvent may be 30% the weight of the resin composition. The resin composition may comprise vinyl-terminated PDMS, H—Si polysiloxane oil, polymerization inhibitor, and platinum complex. The vinyl-terminated PDMS may be 20% by weight of the resin compostion. The H—Si polysiloxane oil may be 10% by weight of the resin compostion. The polymerization inhibitor may be 0.1% by weight of the resin compostion. The platinum complex may be 0.5% by weight of the resin compostion.

In the present example, the particles of the nickel-coated graphite powder may have irregular round or oval shapes with a size distribution of 50-150 μm.

The methods of manufacturing the single-component conductive adhesive with low hardness described in example 2 are provided. The conductive adhesive with low hardness may be obtained by performing one or more of the following operations. The resin composition and the organic solvent may be introduced into a stirring device. The stirring device may be sealed after the resin composition and the organic solvent are introduced into the stirring device. The temperature in the stirring device may be kept at 23±5° C. The mixture of the resin composition and the organic solvent may be stirred in the stirring device for 5-10 minutes at a stirring speed of 200 r/min. During the stirring process, the pressure in the stirring device may be kept below 0.07 MPa. The nickel-coated graphite powder may be introduced into the stirring device after the resin composition and the organic solvent is homogenized. The mixture and the introduced nickel-coated graphite powder may be stirred for 5-10 minutes.

In the present example, the nickel-coated graphite powder may be divided into several portions by weight of its total amount. Between the introduction of each portion of the nickel-coated graphite powder into the stirring device, 5-10 minutes may be needed to homogenize the nickel-coated graphite powder in the mixture.

Example 3

The single-component conductive adhesive with low hardness may include a resin composition, an organic solvent and nickel-coated graphite powder. The weight ratio of the resin composition to the nickel-coated graphite powder may be 56:40. The weight of the organic solvent may be 7% the weight of the resin composition. The resin composition may comprise vinyl-terminated PDMS, H—Si polysiloxane oil, polymerization inhibitor, and platinum complex. The vinyl-terminated PDMS may be 40% by weight of the resin compostion. The H—Si polysiloxane oil may be 15% by weight of the resin compostion. The polymerization inhibitor may be 0.15% by weight of the resin compostion. The platinum complex may be 1% by weight of the resin compostion.

In the present example, the particles of the nickel-coated graphite powder may have irregular round or oval shapes with a size distribution of 50-150 μm.

The methods of manufacturing the single-component conductive adhesive with low hardness described in example 3 are provided. The conductive adhesive with low hardness may be obtained by performing one or more of the following operations. The resin composition and the organic solvent may be introduced into a stirring device. The stirring device may be sealed after the resin composition and the organic solvent are introduced into the stirring device. The temperature in the stirring device may be kept at 23±5° C. The mixture of the resin composition and the organic solvent may be stirred in the stirring device for 5-10 minutes at a stirring speed of 200 r/min. During the stirring process, the pressure in the stirring device may be kept below 0.07 MPa. The nickel-coated graphite powder may be introduced into the sealed stirring device after the resin composition and the organic solvent is homogenized. The mixture and the introduced nickel-coated graphite powder may be stirred for 5-10 minutes.

In the present example, the nickel-coated graphite powder may be divided into several portions by weight of its total amount. Between the introduction of each portion of the nickel-coated graphite powder into the stirring device, 5-10 minutes may be needed to homogenize the nickel-coated graphite powder in the mixture.

Example 4

The single-component conductive adhesive with low hardness may include a resin composition, an organic solvent and nickel-coated graphite powder. The weight ratio of the resin composition to the nickel-coated graphite powder may be 30:60. The weight of the organic solvent may be 33% the weight of the resin composition. The resin composition may comprise vinyl-terminated PDMS, H—Si polysiloxane oil, polymerization inhibitor, and platinum complex. The vinyl-terminated PDMS may be 25% by weight of the resin compostion. The H—Si polysiloxane oil may be 5% by weight of the resin compostion. The polymerization inhibitor may be 0.1% by weight of the resin compostion. The platinum complex may be 0.1% by weight of the resin compostion. The platinum complex may be encapsulated in a capsule using micro capsule techniques. Successive membranes made of polymer compound may be used in the micro capsule technique to wrap the platinum complex. At the room temperature, the successive membranes may keep stability and prevent the reaction between the platinum complex and the H—Si polysiloxane oil by separating the two components from each other. The successive membranes may fuse or melt at a certain temperature, which enables the reaction between the platinum complex and the H—Si polysiloxane oil. The successive membranes may be compatible with silica gel.

In the present example, the particles of the nickel-coated graphite powder may have irregular round or oval shapes with a size distribution of 50-150 μm.

The methods of manufacturing the single-component conductive adhesive with low hardness described in example 4 are provided. The conductive adhesive with low hardness may be obtained by performing one or more of the following operations. The resin composition and the organic solvent may be introduced into a stirring device. The stirring device may be sealed after the resin composition and the organic solvent are introduced into the stirring device. The temperature in the stirring device may be kept at 23±5° C. The mixture of the resin composition and the organic solvent may be stirred in the stirring device for 5-10 minutes at a stirring speed of 200 r/min. During the stirring process, the pressure in the stirring device may be kept below 0.07 MPa. The nickel-coated graphite powder may be introduced into the stirring device after the resin composition and the organic solvent is homogenized. The mixture and the introduced nickel-coated graphite powder may be stirred for 5-10 minutes.

In the present example, the nickel-coated graphite powder may be divided into several portions by weight of its total amount. Between the introduction of each portion of the nickel-coated graphite powder into the stirring device, 5-10 minutes may be needed to homogenize the nickel-coated graphite powder in the mixture.

Samples of the conductive adhesives were manufactured according to the four examples set forth above. For each example, three samples (the three samples were used in test 1, test 2, and test 3, respectively) of corresponding conductive adhesives were manufactured. To evaluate the mechanical and electrical properties of the conductive adhesives, tests of various types were performed on the samples. Testing items in the tests included surface resistivity/volume resistivity, tensile strength/elongation rate/tear strength, compression deformation rate, and adhesive force. For each sample, three tests were performed in the same conditions, and an average value was obtained as the result of the three tests. The testing results are provided as follows:

Example 1

|  | Test 1 | Test 2 | Test 3 |
| --- | --- | --- | --- |
| Shore hardness (Shore A) | 42 | 43 | 42 |
| Surface resistivity (Ohm/inch) | 0.025 | 0.026 | 0.025 |
| Volume resistivity (Ohm*cm) | 0.023 | 0.024 | 0.023 |
| Tensile strength (PSI) | 154 | 152 | 152 |
| Elongation rate | 196% | 199% | 200% |
| Tear strength (PPI) | 13.75 N | 13.45 N | 14.12 N |
| Compression deformation rate | 20% | 23% | 22% |
| Adhesive force (N/cm) | 13.68 | 13.71 | 13.71 |

Example 2

|  | Test 1 | Test 2 | Test 3 |
| --- | --- | --- | --- |
| Shore hardness (Shore A) | 46 | 47 | 47 |
| Surface resistivity (Ohm/inch) | 0.026 | 0.028 | 0.028 |
| Volume resistivity (Ohm*cm) | 0.025 | 0.024 | 0.024 |
| Tensile strength (PSI) | 153 | 150 | 152 |
| Elongation rate | 88% | 95% | 101% |
| Tear strength (PPI) | 11.85 N | 10.64 N | 10.46 N |
| Compression deformation rate | 25% | 24% | 26% |
| Adhesive force (N/cm) | 10.87 | 11.23 | 10.18 |

Example 3

|  | Test 1 | Test 2 | Test 3 |
| --- | --- | --- | --- |
| Shore hardness (Shore A) | 38 | 37 | 36 |
| Surface resistivity (Ohm/inch) | 0.053 | 0.052 | 0.051 |
| Volume resistivity (Ohm*cm) | 0.048 | 0.049 | 0.047 |
| Tensile strength (PSI) | 152 | 151 | 154 |
| Elongation rate | 302% | 311% | 325% |
| Tear strength (PPI) | 13.95 N | 13.87 N | 14.05 N |
| Compression deformation rate | 33% | 36% | 28% |
| Adhesive force (N/cm) | 14.06 | 13.83 | 13.96 |

Example 4

|  | Test 1 | Test 2 | Test 3 |
| --- | --- | --- | --- |
| Shore hardness (Shore A) | 40 | 42 | 41 |
| Surface resistivity (Ohm/inch) | 0.026 | 0.027 | 0.027 |
| Volume resistivity (Ohm*cm) | 0.026 | 0.025 | 0.024 |
| Tensile strength (PSI) | 153 | 152 | 153 |
| Elongation rate | 195% | 199% | 201% |
| Tear strength (PPI) | 13.60 N | 13.48 N | 14.15 N |
| Compression deformation rate | 35% | 38% | 36% |
| Adhesive force (N/cm) | 9.5 | 8.87 | 9.46 |

As shown above, there is a large difference between the amount of vinyl-terminated PDMS and H—Si polysiloxane oil in Example 1 and Example 3. In view of the test results, it may be concluded that the increase in the proportion of the vinyl-terminated PDMS and the H—Si polysiloxane oil in the total weight may lead to an enhancement of the electrical property and the compression deformation rate of the conductive adhesive. In the meanwhile, the large variation between test results of different samples may indicate that the increase of the vinyl-terminated PDMS and the H—Si polysiloxane oil results in instability of the electrical property and physical property of the conductive adhesive. Thus, the introduction of polymerization inhibitor and encapsulated platinum complex may enhance the electrical and physical stability of the conductive adhesive.

In terms of the proportion of the platinum complex, there is a large difference between Example 1 and Example 4. It may be seen from the test results that a large variation may exist in terms of adhesive force and compression deformation rate between Example 1 and Example 4, and the variation between different testing items are not synchronized. Thus, Example 1 may be better among the four examples in terms of the proportion of the platinum complex. In the meanwhile, the shore hardnesses of the four examples are 42 Shore A, 47 Shore A, 37 Shore A, and 41 Shore A, respectively. Samples with lower shore hardness may be better. Although the conductive adhesive of Example 3 corresponds to a lower shore hardness, other properties, especially for the electrical properties, of the conductive adhesive of Example 3 are not optimal.

Having thus described the exemplary embodiments, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described. The present disclosure is defined by the following claims, with equivalents of the claims to be included therein.

I claim:

1. A conductive adhesive comprising:
   a resin composition including:
   vinyl-terminated polydimethylsiloxane (PDMS) at a weight ratio of 20-40% of the resin composition;
   H—Si polysiloxane oil at a weight ratio of 5-15% of the resin composition;
   polymerization inhibitor at a weight ratio of 0.05-0.15% of the resin composition; and
   platinum complex at a weight ratio of 0.1-1% of the resin composition, the platinum complex being encapsulated in a capsule made of polymer compound membranes;
   an organic solvent; and
   nickel-coated graphite powder, particles of the nickel-coated graphite powder having a size distribution of 50-150 μm,
   the weight ratio of the resin composition to the nickel-coated graphite powder being 20%:80% or 40%:60%, the weight of the organic solvent being 20-40% the weight of the resin composition, a shore hardness of the conductive adhesive being within a range of 35 to 50 Shore A.

2. The conductive adhesive of claim 1, wherein particles of the nickel-coated graphite powder have irregularly round shapes with a size distribution of 50-150 μm.

3. A method of manufacturing the conductive adhesive of claim 1, the method comprising:
   introducing the resin composition and the organic solvent into a stirring device;
   stirring the resin composition and the organic solvent for 5 minutes at a stirring speed of 200 r/min, the temperature in the stirring device being maintained at 23±5° C., the pressure in the stirring device being maintained below 0.07 MPa; and
   introducing the nickel-coated graphite powder into the stirring device.

4. The method of claim 3, further comprising:
   dividing the nickel-coated graphite powder into two portions including a first portion and a second portion;
   introducing the first portion of the nickel-coated graphite powder into the stirring device;
   stirring a first mixture in the stirring device with the introduced first portion of the nickel-coated graphite powder for 5-10 minutes to obtain a second mixture, the first mixture in the stirring device including the resin composition and the organic solvent;
   introducing the second portion of the nickel-coated graphite powder into the stirring device; and
   stirring the second mixture in the stirring device with the introduced second portion of the nickel-coated graphite powder for 5-10 minutes.

5. A method of using the conductive adhesive of claim 1, the method comprising:
   curing the conductive adhesive for 30 minutes at a temperature of 150° C.

* * * * *